United States Patent
Bai

(12) 
(10) Patent No.: US 6,710,434 B1
(45) Date of Patent: Mar. 23, 2004

(54) WINDOW-TYPE SEMICONDUCTOR PACKAGE AND FABRICATION METHOD THEREOF

(75) Inventor: Jin-Chuan Bai, Hsinchu (TW)

(73) Assignee: Ultratera Corporation, Hsin-Chu (TW)

( * ) Notice: Subject to any disclaimer, the term of this patent is extended or adjusted under 35 U.S.C. 154(b) by 0 days.

(21) Appl. No.: 10/261,833

(22) Filed: Sep. 30, 2002

(51) Int. Cl.⁷ .............................................. H01L 23/06
(52) U.S. Cl. ..................... 257/684; 257/784; 257/780; 257/778; 257/779; 257/790
(58) Field of Search .................. 257/684, 778–790, 257/693, 729, 795

(56) References Cited

U.S. PATENT DOCUMENTS 6,218,731 B1 * 4/2001 Huang et al. ................ 257/738
6,265,768 B1 * 7/2001 Su et al. ..................... 257/684
6,501,170 B1 * 12/2002 Dickey et al. ............... 257/702

* cited by examiner

*Primary Examiner*—David L. Talbott
*Assistant Examiner*—Luan Thai
(74) *Attorney, Agent, or Firm*—Fulbright & Jaworski LLC

(57) ABSTRACT

A window-type semiconductor package and a fabrication method thereof are provided. A substrate having an opening is mounted with at least a chip in a manner that, a conductive area of an active surface of the chip is exposed to the opening, and electrically connected to the substrate by bonding wires formed through the opening. A non-conductive material is applied over the conductive area of the chip. An upper encapsulant is formed to encapsulate the chip, and a lower encapsulant is formed to encapsulate the bonding wires and the non-conductive material. The non-conductive material interposed between the chip and the lower encapsulant helps prevent the chip from cracking at end portions thereof due to shrinkage of the lower encapsulant, and also helps secure the bonding wires in position within the opening of the substrate without causing wire-sweeping, such that reliability and yield of the semiconductor package can be assured.

7 Claims, 4 Drawing Sheets

WINDOW-TYPE SEMICONDUCTOR PACKAGE AND FABRICATION METHOD THEREOF

FIELD OF THE INVENTION

The present invention relates to semiconductor packages and fabrication methods thereof, and more particularly, to a window-type semiconductor package for preventing chip-cracking and wire-sweeping, and a method for fabricating the same.

BACKGROUND OF THE INVENTION

Window-type semiconductor packages are advanced packaging technology, characterized by forming at least an opening penetrating through a substrate, allowing a chip to be mounted over the opening, and electrically connected to the substrate by bonding wires through the opening. This arrangement allows length of the bonding wires to be effectively shortened, thereby facilitating electrical transmission or performances between the chip and the substrate.

A conventional window-type semiconductor structure 1 is illustrated in FIGS. 3A and 3B, wherein a substrate 10 has an upper surface 100 and a lower surface 101, and is formed with an opening 102 penetrating through the same. A chip 11 is mounted on the upper surface 100 of the substrate 10 in a face-down manner as to allow bond pads 111 formed on an active surface 110 of the chip 11 to be exposed to the opening 102. A plurality of bonding wires 12 are formed through the opening 102 and bonded to the exposed bond pads 111 of the chip 11, so as to electrically connect the active surface 110 of the chip 11 to the lower surface 101 of the substrate 10. Then, a lower encapsulant 13 is formed on the lower surface 101 of the substrate 10 by a printing process, for encapsulates the bonding wires 12 and sealing the opening 102.

However, due to material mismatch in coefficient of thermal expansion (CTE) between the lower encapsulant 13 (formed by a resin compound) and the chip 11 directly in contact with the lower encapsulant 13, under a high temperature condition such as curing of the lower encapsulant 13 or subsequent thermal cycles, the chip 11 particularly at end portions thereof (as circled in FIG. 3B) would be subject to greater thermal stress from the lower encapsulant 13 and cracks due to shrinkage of the lower encapsulant 13, chip-cracking problems are severe for relatively long or large-scale chips, making reliability and yield of fabricated products undesirably degraded. Moreover, during fabrication of the lower encapsulant 13, the bonding wires 12 directly encounter mold flow impact from the resin compound for forming the lower encapsulant 13, and thereby easily lead to wire-sweeping or short-circuiting problems.

SUMMARY OF THE INVENTION

An objective of the present invention is to provide a window-type semiconductor package and a fabrication method thereof, for enhancing mechanical strength of a chip mounted therein and for preventing chip cracks from occurrence.

Another objective of the invention is to provide a window-type semiconductor package and a fabrication method thereof, A further objective of the invention is to provide a window-type semiconductor package and a fabrication method thereof, In accordance with the above and other objectives, the present invention proposes a window-type semiconductor package and a fabrication method thereof. The window-type semiconductor package comprises: a substrate having an upper surface and a lower surface opposed to the upper surface, and formed with at least an opening penetrating through the upper and lower surfaces, at least a chip having an active surface and a non-active surface opposed to the active surface, wherein the active surface of the chip is mounted over the opening on the upper surface of the substrate, allowing a conductive area of the active surface to be exposed to the opening; a plurality of bonding wires formed through the opening for electrically connecting the conductive area of the chip to the lower surface of the substrate; a non-conductive material applied over the conductive area of the chip within the opening of the substrate; an upper encapsulant formed on the upper surface of the substrate for encapsulating the chip; a lower encapsulant formed on the lower surface of the substrate for encapsulating the bonding wires and the non-conductive material; and a plurality of solder balls implanted on the lower surface of the substrate at area outside the lower encapsulant.

The non-conductive material applied over the conductive area of the chip is low in viscosity, and has coefficient of thermal expansion (CTE) between that of the chip and of a resin material for fabricating the lower encapsulant; preferably, the non-conductive material may be silicone. The non-conductive material is applied by printing or dispensing technique through the use of a stencil mounted on the lower surface of the substrate around the opening without interfering the bonding wires, wherein the stencil is formed with a through hole corresponding in position to the conductive area of the chip, so as to allow the non-conductive material to be applied through the through hole of the stencil into the opening of the substrate and over the conductive area of the chip.

The above semiconductor package provides significant benefits. The non-conductive material interposed between the chip and the lower encapsulant, has low viscosity and intermediate CTE, and may serve as buffer to reduce thermal stress exerted from the lower encapsulant to the chip and to prevent the chip from cracking at end portions thereof, which chip-cracking is discussed in the prior art and caused by shrinkage of a lower encapsulant in direct contact with a chip during a curing or subsequently high-temperature process. Moreover, the non-conductive material encapsulates part of the bonding wires within the opening of the substrate; this helps secure the bonding wires in position and prevent wire-sweeping from occurrence during fabrication of the lower encapsulant for encapsulating the bonding wires. Therefore, in free concern of chip-cracking and wire-sweeping, reliability and yield of the semiconductor package can be desirably improved.

BRIEF DESCRIPTION OF THE DRAWINGS

The present invention can be more fully understood by reading the following detailed description of the preferred embodiments, with reference made to the accompanying drawings, wherein:

FIGS. 2A–2G are schematic diagrams showing fabrication processes for a semiconductor package according to the invention, wherein FIG. 2D is a bottom view of FIG. 2C.

DETAILED DESCRIPTION OF THE PREFERRED EMBODIMENTS

Preferred embodiments for a semiconductor package proposed in the present invention are described in more detail as follows with reference to FIGS. 1 and 2A–2G.

Figure 1:
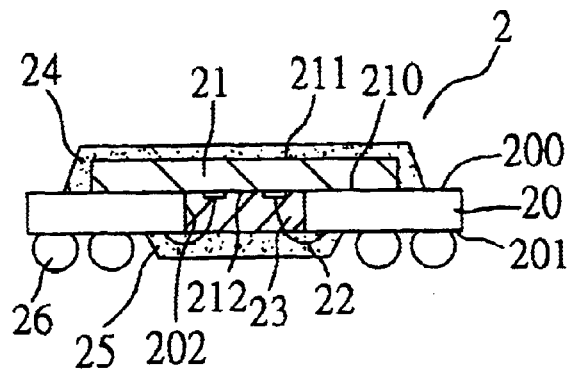
FIG. 1 is a cross-sectional view of a semiconductor package according to the invention.

FIG. 1 illustrates a window-type semiconductor package 2 according to the invention. This semiconductor package 2 comprises: a substrate 20 having an upper surface 200 and a lower surface 201 opposed to the upper surface 200, and formed with at least an opening 202 penetrating through the upper and lower surfaces 200, 201; at least a chip 21 having an active surface 210 and a non-active surface 211 opposed to the active surface 210, wherein the active surface 210 of the chip 21 is mounted over the opening 202 on the upper surface 200 of the substrate 20, allowing a conductive area 212 of the active surface 210 to be exposed to the opening 202; a plurality of bonding wires 22 formed through the opening 202 for electrically connecting the conductive area 212 of the chip 21 to the lower surface 201 of the substrate 20; a non-conductive material 23 applied over the conductive area 212 of the chip 21 within the opening 202 of the substrate 20; an upper encapsulant 24 formed on the upper surface 200 of the substrate 20 for encapsulating the chip 21; a lower encapsulant 25 formed on the lower surface 201 of the substrate 20 for encapsulating the bonding wires 22 and the non-conductive material 23; and a plurality of solder balls 26 implanted on the lower surface 201 of the substrate 20 at area outside the lower encapsulant 25.

The above semiconductor package 2 can be fabricated by process steps illustrated in FIGS. 2A–2G.

Figure 2A:
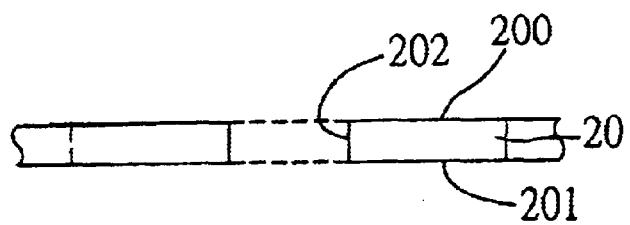

Referring to FIG. 2A, the first step is to prepare a substrate 20 having an upper surface 200 and a lower surface 201 opposed to the upper surface 200, and at least an opening 202 is formed through the upper and lower surfaces 200, 201 of the substrate 20. The substrate 20 is primarily made of a conventional resin material, such as epoxy resin, polyimide, BT (bismaleimide triazine) resin, FR-4 resin, etc.

Figure 2B:
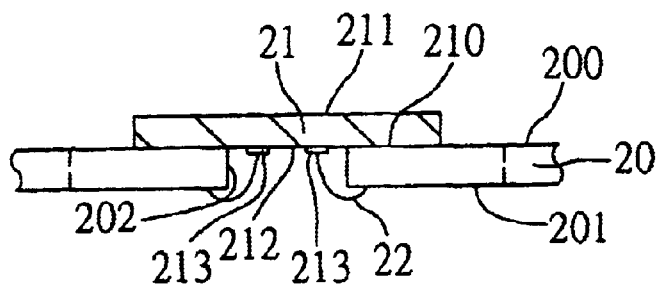

Referring to FIG. 2B, the next step is to mount at least a chip 21 on the upper surface 200 of the substrate 20. The chip 21 has an active surface 210 where a plurality of electronic elements and circuits (not shown) are formed, and a non-active surface 211 opposed to the active surface 210. The active surface 210 of the chip 21 is disposed over the opening 202 on the upper surface 200 of the substrate 20, allowing a conductive area 212 of the active surface 210, where at least two rows of bond pads 213 are formed, to be exposed to the opening 202.

Then, a wire-bonding process is performed to form a plurality of bonding wires 22 such as gold wires through the opening 202 of the substrate 20, wherein the bonding wires 22 are bonded to the bond pads 213 on the conductive area 212 of the chip 21 and to the lower surface 201 of the substrate 20, so as to allow the active surface 210 of the chip 21 to be electrically connected to the substrate 20 by the bonding wires 22.

Figure 2C:
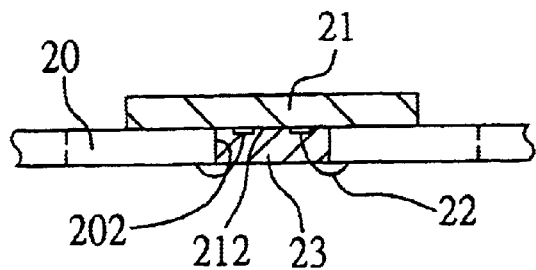
Figure 2D:
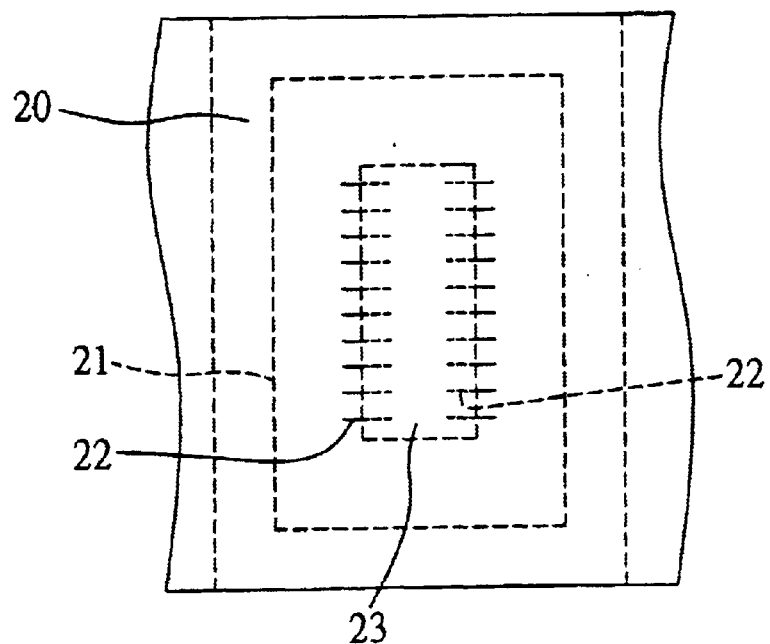

Referring to FIGS. 2C and 2D (a bottom view of FIG. 2C), a non-conductive material 23 is applied over the conductive area 212 of the chip 21 within the opening 202 of the substrate 20, allowing the non-conductive material 23 to completely cover the conductive area 212 of the chip 21. The non-conductive material 23 is low in viscosity, and has coefficient of thermal expansion (CTE) between that of the chip 21 and of a resin material (not shown) subsequently used for encapsulating the bonding wires 22, preferably, the non-conductive material 23 may be silicone.

Figure 2E:
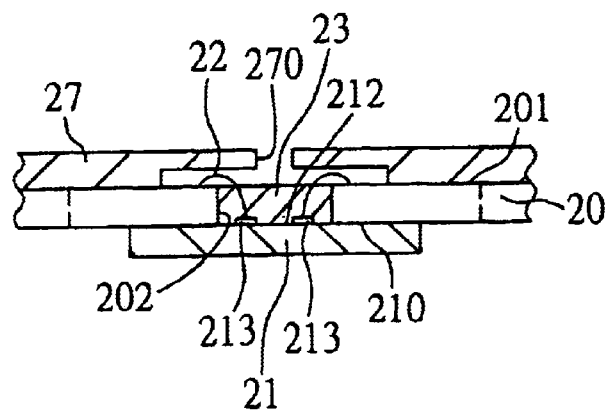

For applying the non-conductive material 23, as shown in FIG. 2E, the substrate 20 mounted with the chip 21 thereon is turned upside down, allowing the lower surface 201 of the substrate 20 and the active surface 210 of the chip 21 to face upwardly. Then, a stencil 27 is attached to the lower surface 201 of the substrate 20 around the opening 202 without interfering the bonding wires 22, wherein the stencil 27 is formed with a through hole 270 corresponding in position to the conductive area 212 of the chip 21 and sized not greater than distance between the two rows of the bond pads 213. Conventional printing or dispensing technology is employed to apply the non-conductive material 23 through the through hole 270 of the stencil 27 into the opening 202 of the substrate 20 and over the conductive area 212 of the chip 21, wherein the non-conductive material 23 may be adapted to completely fill the opening 202 of the substrate 20. And, the limited-sized through hole 270 of the stencil 27 allows the non-conductive material 23 to be comfortably situated within the opening 202 of the substrate 20 without flashing over unintended area such as the lower surface 201 of the substrate 20. After the non-conductive material 23 is cured, the substrate 20 is turned again for facing the chip 21 upwardly, as shown in FIG. 2C. It should be understood that, other techniques or processes suitable for application of the non-conductive material 23 are encompassed within the scope of this invention.

Figure 2F:
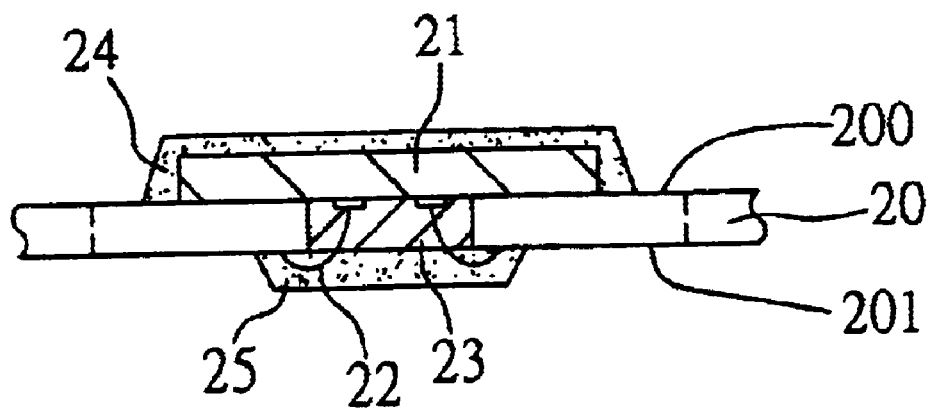

Referring to FIG. 2F, a conventional printing process is performed to form a lower encapsulant 25 on the lower surface 201 of the substrate 20 for encapsulating the bonding wires 22 and the non-conductive material 23.

Then, a molding process is performed to form an upper encapsulant 24 on the upper surface 200 of the substrate 20 for encapsulating the chip 21, wherein the upper encapsulant 24 may be made of a conventional resin compound such as epoxy resin.

Figure 2G:
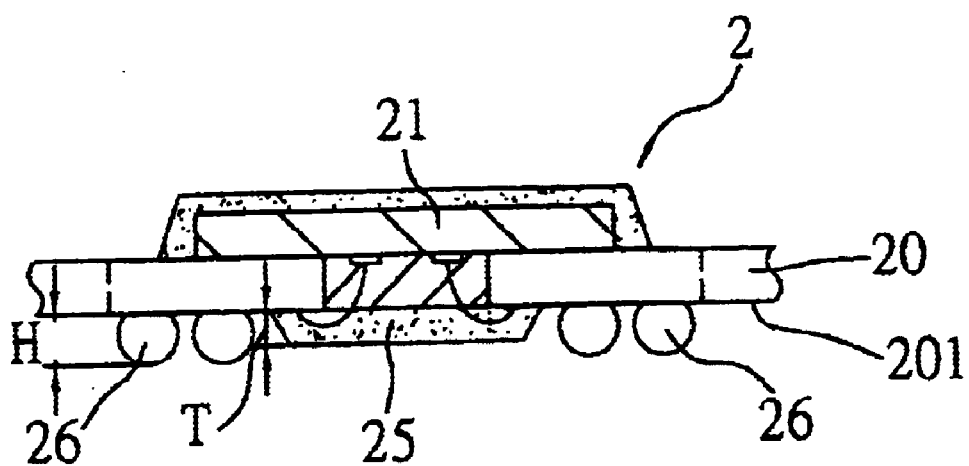
Figure 3A:
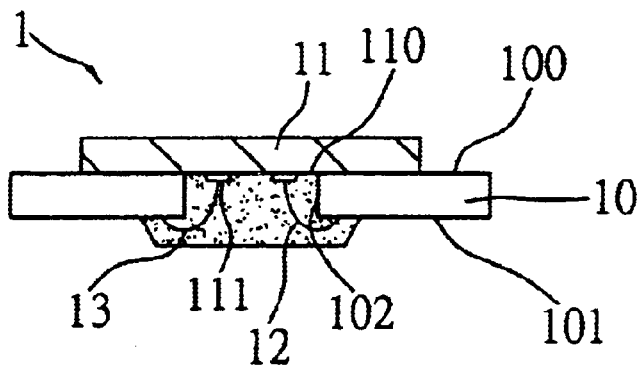
FIGS. 3A and 3B (PRIOR ART) are respectively a cross-sectional view and a top view of a conventional semiconductor structure.
Figure 3B:
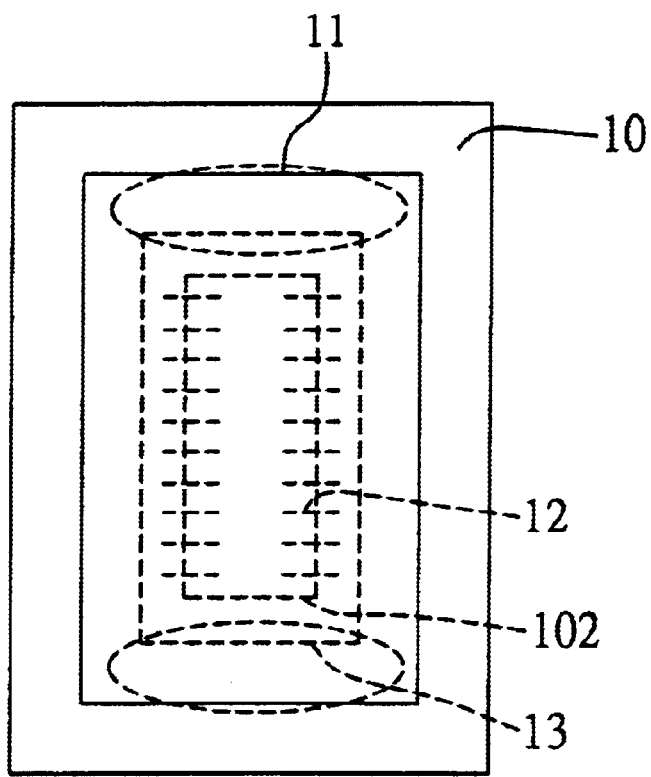

Finally referring to FIG. 2G, a ball-implantation process is performed to implant a plurality of solder balls 26 on the lower surface 201 of the substrate 20, wherein the solder balls 26 are positioned at area outside the lower encapsulant 25, and dimensioned in height H larger than thickness T of the lower encapsulant 25 protruding from the lower surface 201 of the substrate 20, i.e. H>T. The solder balls 26 serve as input/output (I/O) ports for electrically connecting the chip 21 to an external device such as printed circuit board (PCB, not shown). This completes fabrication of the semiconductor package 2.

The above semiconductor package 2 provides significant benefits. The non-conductive material 23 interposed between the chip 21 and the lower encapsulant 25, has low viscosity and intermediate CTE, and may serve as buffer to reduce thermal stress exerted from the lower encapsulant 25 to the chip 21 and to prevent the chip 21 from cracking at end portions thereof, which chip-cracking is discussed in the prior art and caused by shrinkage of a lower encapsulant in direct contact with a chip during a curing or subsequently high-temperature process. Moreover, the non-conductive material 23 encapsulates part of the bonding wires 22 within the opening 202 of the substrate 20; this helps secure the bonding wires 22 in position and prevent wire-sweeping from occurrence during fabrication of the lower encapsulant 25 for encapsulating the bonding wires 22. Therefore, in free concern of chip-cracking and wire-sweeping, reliability and yield of the semiconductor package 2 can be desirably improved.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements

What is claimed is:

1. A window-type semiconductor package, comprising:
   a substrate having an upper surface and a lower surface opposed to the upper surface, and formed with at least an opening penetrating through the upper and lower surfaces;
   at least a chip having an active surface and a non-active surface opposed to the active surface, wherein the active surface of the chip is mounted over the opening on the upper surface of the substrate, allowing a conductive area of the active surface to be exposed to the opening;
   a plurality of bonding wires formed through the opening for electrically connecting the conductive area of the chip to the lower surface of the substrate;
   a non-conductive material applied over the conductive area of the chip within the opening of the substrate, the non-conductive material completely filling the opening of the substrate;
   an upper encapsulant formed on the upper surface of the substrate for encapsulating the chip; and
   a lower encapsulant formed on the lower surface of the substrate for encapsulating the bonding wires and the non-conductive material.

2. The semiconductor package of claim 1, further comprising: a plurality of solder balls implanted on the lower surface of the substrate at an area outside the lower encapsulant.

3. The semiconductor package of claim 2, wherein height of the solder balls is larger than thickness of the lower encapsulant protruding from the lower surface of the substrate.

4. The semiconductor package of claim 1, wherein the non-conductive material is low in viscosity.

5. The semiconductor package of claim 1, wherein the non-conductive material has a coefficient of thermal expansion between that of the chip and of a resin material for fabricating the lower encapsulant.

6. The semiconductor package of claim 1, wherein the non-conductive material is silicone.

7. The semiconductor package of claim 1, wherein the conductive area of the chip is formed with a plurality of bond pads where the bonding wires are bonded.

* * * * *